(12) United States Patent
Fujisawa et al.

(10) Patent No.: US 6,184,567 B1
(45) Date of Patent: Feb. 6, 2001

(54) FILM CAPACITOR AND SEMICONDUCTOR PACKAGE OR DEVICE CARRYING SAME

(75) Inventors: Akira Fujisawa; Tsuyoshi Shibamoto; Tsuyoshi Kobayashi; Shoji Watanabe; Yoshihiro Ihara, all of Nagano (JP)

(73) Assignee: Shinko Electric Industries Co., Ltd., Nagano (JP)

( * ) Notice: Under 35 U.S.C. 154(b), the term of this patent shall be extended for 0 days.

(21) Appl. No.: 08/965,653

(22) Filed: Nov. 6, 1997

(30) Foreign Application Priority Data

Nov. 8, 1996  (JP) .................................................. 8-296436

(51) Int. Cl.[7] .................................................. H01L 29/00
(52) U.S. Cl. ........................ 257/532; 257/534; 257/924; 361/301.4; 361/306.2
(58) Field of Search .................................. 257/300, 532, 257/534, 924; 361/298.4, 301.4, 306.2, 307, 321.4, 321.5

(56) References Cited

U.S. PATENT DOCUMENTS

| | | | |
|---|---|---|---|
| 4,494,169 | * | 1/1985 | Watson .................................. 361/306 |
| 5,099,388 | * | 3/1992 | Ogawa et al. ........................ 361/321 |
| 5,144,526 | | 9/1992 | Vu et al. ............................... 361/321 |
| 5,590,017 | * | 12/1996 | Kelso .................................. 361/321.4 |
| 5,767,564 | * | 6/1998 | Kunimatsu et al. ................... 257/532 |

FOREIGN PATENT DOCUMENTS

| | | |
|---|---|---|
| 37 24 703 A1 | 1/1988 | (DE) . |
| 0 397 391 | 11/1990 | (EP) . |
| 2 176 654 | 12/1986 | (GB) . |
| 362043161 * | 2/1987 | (JP) ...................................... 257/924 |
| 63-1340 | 7/1988 | (JP) . |
| 401191461 * | 8/1989 | (JP) ...................................... 257/924 |
| 1-248 589 | 10/1989 | (JP) . |
| 406132472 * | 5/1994 | (JP) ...................................... 257/924 |
| 406163805 * | 6/1994 | (JP) ...................................... 257/532 |
| 406236961 * | 8/1994 | (JP) ...................................... 257/532 |

OTHER PUBLICATIONS

Parisi, J. "Decoupling Capacitor Placement", IBM Technical Disclosure Bulletin, vol. 19, No. 8, Jan. 1977, pp. 3046–3047.

* cited by examiner

Primary Examiner—Jerome Jackson, Jr.
Assistant Examiner—George C. Eckert, II
(74) Attorney, Agent, or Firm—Pennie & Edmonds LLP

(57) ABSTRACT

A thin film capacitor comprises a substrate having first and second surfaces, a first electrode film formed on the first surface of the substrate, a high-dielectric film formed on the first electrode film, a second electrode film formed on said high-dielectric film, first and second external connection terminals formed on the second surface of the substrate opposite to the first surface on which the first electrode film is formed in such a manner that the first and second external connection terminals are electrically connected to the first and second electrode films, respectively.

10 Claims, 5 Drawing Sheets

FILM CAPACITOR AND SEMICONDUCTOR PACKAGE OR DEVICE CARRYING SAME

BACKGROUND OF THE INVENTION

1. Field of the Invention

The present invention relates to a film capacitor and a semiconductor device and a package carrying the same.

2. Description of the Related Art

A countermeasure for noise has become important as a semiconductor chip operates at a high speed and is highly integrated. Particularly, to reduce a noise originated from an electric power supply source, it is necessary to provide a capacitor between the power source and the ground. Generally, the capacitor is located outside the semiconductor device and far from the semiconductor chip in the prior art, and therefore, the countermeasure for noise is insufficient.

To solve this problem, a chip capacitor may be mounted, for example, on a front end of a lead of a lead frame.

If the chip capacitor is mounted on the front end of the lead frame, the distance from the semiconductor chip becomes shorter to reduce the noise.

However, it is troublesome to mount the chip capacitor to the front end of a thin lead frame, which therefore results in the increase in the production cost.

SUMMARY OF THE INVENTION

Accordingly, the present invention has been made to solve such problems in the prior art, and an object thereof is to provide a semiconductor device having a film capacitor, capable of being easily handled and mounted as well as effectively reducing a noise originated from an electric power supply source.

According to the present invention, there is provided a thin film capacitor comprising: a substrate having first and second surfaces; a first electrode film formed on the first surface of the substrate; a high-dielectric film formed on the first electrode film; a second electrode film formed on said high-dielectric film; and at least one external connection terminal formed on the second surface of the substrate opposite to the first surface on which the first electrode film is formed in such a manner that the external connection terminal is electrically connected to the first electrode film.

The external connection terminal may be a ball bump. By using external connection terminals such as ball bumps, it is possible to easily mount the film capacitor on the power source line and ground line of the lead frame while being connected to the power supply pad and the ground pad.

The thin film capacitor may further comprise a plated layer formed on the first surface of the substrate so that the first electrode film is formed on this plated layer.

It is possible to increase a breakdown voltage by forming a plated layer on a surface of the substrate to smooth the same and forming the first electrode layer thereon while eliminating pin holes therefrom.

The substrate may be made of at least one of iron alloy, copper, or copper alloy and the plated layer is a nickel film. Otherwise, the substrate is made of polyimide and the plated layer consists of a nickel plated layer and a chrome plated layer as an underlayer for the nickel plated layer.

By providing the plated layer on the surface of the substrate to smooth the same and forming the first electrode layer thereon, it is possible to eliminate pin holes from the first electrode layer and increase the breakdown voltage thereof.

According to another aspect of the present invention, there is provided a semiconductor package on which a semiconductor chip is to be mounted, the package comprising: a package body on which at least a power supply line and a ground line are formed; a thin film capacitor such as mentioned above; and the thin film capacitor is mounted on the package body in such a manner that the external connection terminal of the thin film capacitor is electrically connected to one of the power supply and ground lines.

According to still another aspect of the present invention, there is provided a semiconductor device comprising: a package comprising: a package body on which at least a power supply line and a ground line are formed; a thin film capacitor such as mentioned, the thin film capacitor is mounted on the package body in such a manner that the external connection terminal of the thin film capacitor is electrically connected to one of the power supply and ground lines; and a semiconductor chip having at least a power supply pad and a ground pad, the semiconductor chip being mounted on the package in such a manner that the second electrode of the thin film capacitor is electrically connected to one of the power supply and ground pads; and a sealing material hermetically sealing the semiconductor chip on the package.

In this case, if the semiconductor chip is mounted onto the package by a flip-chip connection therewith so that the film capacitor is located within a gap between the semiconductor chip and the package, the space efficiency is enhanced.

According to a still further another aspect of the present invention, there is provided an integrated semiconductor element comprising: a semiconductor chip having at least a power supply pad and a ground pad; a thin film capacitor such as mentioned above; and the thin film capacitor is mounted on the semiconductor chip in such a manner that the external connection terminal of the thin film capacitor is electrically connected to one of the power supply and ground pads.

Another type of thin film capacitor comprises: a substrate having first and second surfaces; a first electrode film formed on the first surface of the substrate; a high-dielectric film formed on the first electrode film; a second electrode film formed on said high-dielectric film; first and second external connection terminals formed on the second surface of the substrate opposite to the first surface on which the first electrode film is formed in such a manner that the first and second external connection terminals are electrically connected to the first and second electrode films, respectively.

BRIEF DESCRIPTION OF THE DRAWINGS

The present invention will be described in more detail below with reference to the preferred embodiments shown in the attached drawings; wherein.

DETAILED DESCRIPTION OF THE EMBODIMENTS

Figure 1:
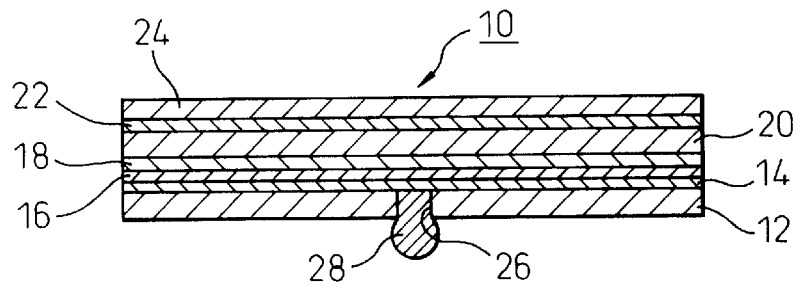
FIG. 1 is a side sectional view of a first embodiment of a film capacitor.

FIG. 1 illustrates a first embodiment of a film capacitor 10.

Reference numeral 12 denotes a polyimide film of approximately 10 μm thick used as a substrate. In this regard, the substrate may be an epoxy film, a polyester film or another, beside the polyimide film.

A chromium-plated layer 14 of several μm thick is formed on the polyimide film 12, and a nickel-plated layer 16 of several μm thick is formed on the chromium-plated layer 14.

A first electrode layer 18 of palladium or platinum of approximately 5000 Å thick is formed by a sputtering method on the nickel-plated layer 16.

A highly dielectric layer 20 of strontium titanate or barium titanate of approximately 1 μm thick is formed by a sputtering method on the first electrode layer 18.

A second electrode layer 22 of palladium or platinum of approximately 5000 Å thick is formed by a sputtering method on the highly dielectric layer 20. A copper-plated layer 24 of approximately 3 μm thick is formed on the second electrode layer 22 for the connection with wires. The second electrode layer may be formed by an epitaxial technology.

A through-hole 26 is provided at a proper portion of the polyimide film 12 by a laser beam to expose the chromium-plated layer 14, on which is formed a ball bump 28 which is a kind of external connection terminal to complete the film capacitor 10. The ball bump 28 is formed by filling the through-hole with solder or nickel and plating the bulged portion with gold.

The first electrode layer 18 may be formed by a direct sputtering on the polyimide film 12.

Figure 2:
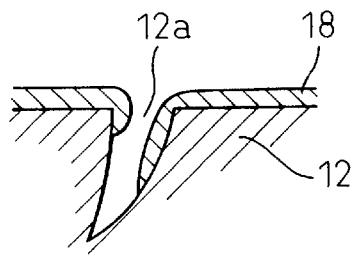
FIG. 2 is an illustration for explaining a drawback of a sputtering layer.

However, if there is a small irregularity on a surface of the polyimide film, for example, if there is an undercut-like recess, as shown in FIG. 2, it was found that a layer reaching the inside of the recess is not formed by the sputtering, and a required durable (or breakdown) voltage is obtainable.

Figure 3:
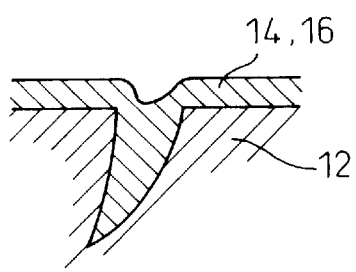
FIG. 3 is an illustration for explaining when a layer is plated on a substrate surface.

To solve this drawback, a plated layer is formed on the polyimide film 12, whereby it is possible to form the first electrode layer 10 having no pin holes therein by carrying out the sputtering method on the plated layer 14, 16 (see FIG. 3).

One example of the production of the film capacitor 10 is as follows:

The chromium plated layer 14, the nickel-plated layer 16, the first electrode layer 18, the highly dielectric layer 20, the second electrode layer 22 and the copper-plated layer are sequentially formed on the polyimide film 12 of a desired size as described before. The through-holes 26 are bored at a predetermined pattern in the polyimide film 12. After the ball bumps 28 are formed in the respective through-holes, the polyimide film is sliced, for example, in a lattice pattern to simultaneously obtain a number of film capacitors 10 (not shown).

Another film capacitor described below is similar to the above.

Figure 4:
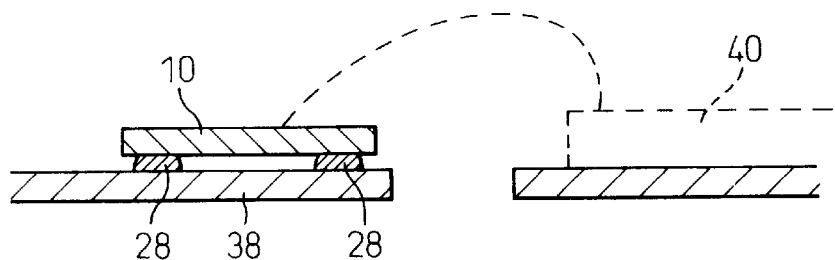
FIGS. 4 and 5 illustrate a state wherein a film capacitor is mounted on a front end of a lead frame, respectively.
Figure 5:
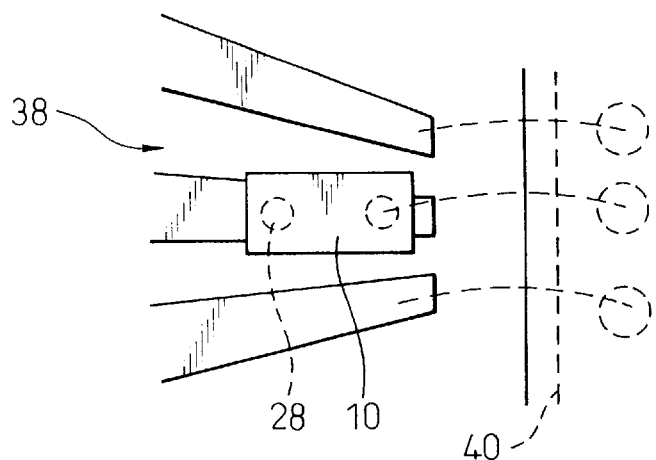

Since the above-mentioned film capacitor 10 has the ball bump 28 bulged from the polyimide film 12, it is possible to easily mount the film capacitor at a front end of a thin lead of a lead frame 38 by a self-alignment function of the ball bump 28 if the same is placed on the front end of the lead and heated, as shown in FIGS. 4 and 5.

To assuredly bond the film capacitor 10 with the lead, a plurality of ball bumps 28 may be provided as shown in FIG. 4. While the film capacitor 10 is mounted on the lead frame 38 which is one example of semiconductor device packages in this embodiment, it may be easily mounted on a circuit pattern of other packages (not shown) such as a ceramic package, a plastic PGA or BGA in a manner similar to that described above.

The film capacitor 10 is mounted onto a power supply line or a ground line of the lead frame 38 while being electrically connected therewith by the ball bump 28, and connected via a wire with a ground pad or a power supply pad of a semiconductor chip 40 carried on the lead frame 38. The semiconductor chip 40 is resin-sealed, and thus a semiconductor device of a resin-sealed type is completed.

Of course, when a ceramic package, plastic PGA or BGA package is used, the semiconductor device package with a film capacitor (not shown) is obtainable by mounting the film capacitor onto the power supply line or the ground line in the same manner as described above. Further, after a semiconductor chip is mounted on such a semiconductor device package and electrically connected as required, the semiconductor chip is sealed with a resin to complete a semiconductor device (not shown).

Figure 6:
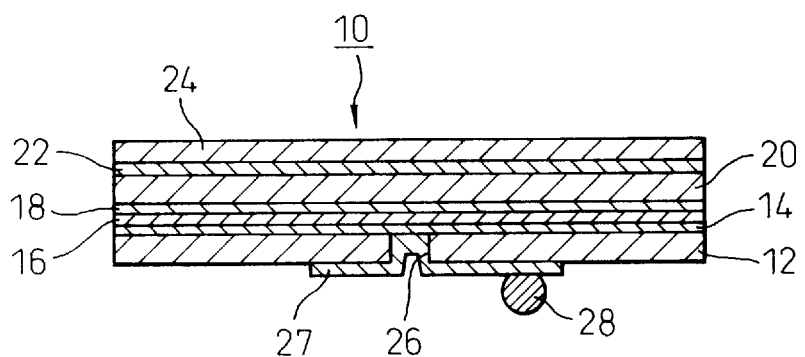
FIGS. 6, 7 and 8 are side sectional views of second, third and fourth embodiments of the film capacitor, respectively.

FIG. 6 illustrates a second embodiment of a film capacitor 10, wherein the same reference numerals are used for designating the same parts as in the preceding embodiment and a description thereof will be eliminated.

In this embodiment, a layer is formed by a sputtering or a plating on the surface of the polyimide film 12 and the through-hole 26 in the polyimide film 12. The layer is etched to provide a circuit pattern 27 on which a ball bump 28 is formed.

The same operation and effect are resulted from this embodiment as described above, and the semiconductor device package and the semiconductor device (not shown) are obtainable as described before.

In this regard, since the ball bump 28 may be formed at a suitable position in the circuit pattern 27, a degree of freedom for providing the ball bump 28 increases.

Figure 7:
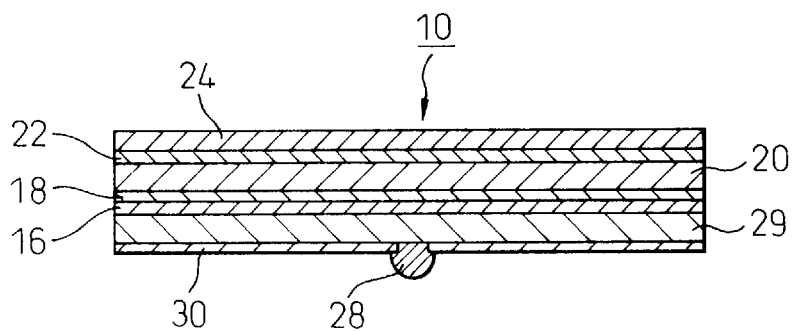

FIG. 7 illustrates a third embodiment of a film capacitor 10, wherein the same reference numerals are used for designating the same parts as in the preceding embodiment and the description thereof will be eliminated.

In this embodiment, as a substrate 29, iron alloys such as 42 alloy (iron/nickel alloy), copper or copper alloys are used instead of the polyimide film 29.

Since the irregularity also exists on a surface of such a metallic substrate 29, a nickel-plated layer 16 is formed thereon, and a first electrode layer 18 is formed thereon by a sputtering method.

A solder resist layer 30 is formed on the lower surface of the substrate 29, in which is provided a through-hole at a suitable position by lithography. A ball bump 28 is formed in the through-hole to provide an external connection terminal.

The same operation and effect are obtainable by this embodiment as that described above, and a semiconductor device package and a semiconductor device (not shown) are also formed therefrom.

Figure 8:
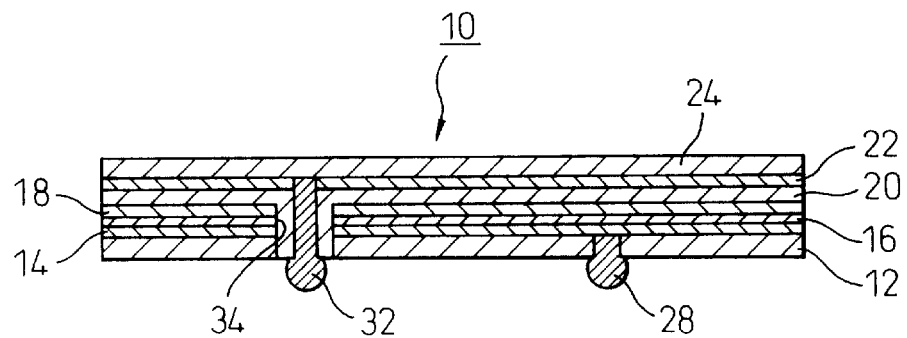

FIG. 8 illustrates a third embodiment of a film capacitor 10, wherein the same reference numerals are used for designating the same pars as in the preceding embodiment and the description thereof will be eliminated.

In this embodiment, a ball bump 32 is provided on the lower surface of the polyimide film 12 in the first embodiment for the electrical connection with a second electrode layer 22, in the same manner as in the first embodiment.

To provide the ball bump 32, after the chromium-plated layer 14 and the nickel-plated layer 16 are formed on the polyimide film 12, a through-hole 34 is formed through the polyimide film 12, the chromium-plated layer 14 and the nickel-plated layer 16 by a laser beam, and a first electrode layer 18 is formed on the nickel-plated layer 16 be a sputtering while masking the through-hole 34. Thereafter, a highly dielectric layer 20 extending to the inner wall of the through-hole 34 is provided by a sputtering, which functions as an insulating layer. In this regard, since the thickness of the polyimide film 12, the chromium-plated layer 14 and the nickel-plated layer 16 is actually extremely small as described above and the depth of the through-hole 34 is also small, the film is formed even on the inner wall of the through-hole 34 by this sputtering.

Next, a second electrode layer 22 is provided on the highly dielectric layer 20 and a copper-plated layer 24 is formed thereon.

The ball bump 32 is formed in the inside of the through-hole 34 and bulges out from the lower surface of the polyimide film 12. The ball bump 28 is formed in the same manner as described above.

Figure 9:
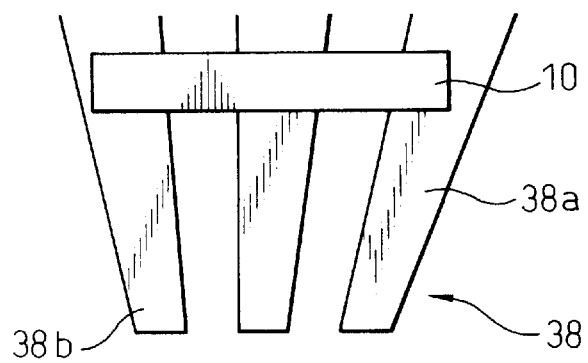
FIGS. 9 and 10 are plan and front views, respectively, of the film capacitor mounted onto the lead frame.
Figure 10:
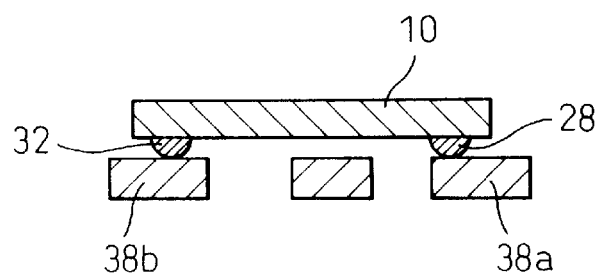

A film capacitor 10 of this embodiment is easily incorporated in a semiconductor device package as shown in FIGS. 9 and 10, by mounting to a power supply line 38 *a* and a ground line 38*b* of a lead frame 38 via the ball bumps 28 and 32.

Since a distance between adjacent leads usually becomes narrower toward a front end thereof as illustrated, it is possible to place the film capacitor to a proper position at which a distance between ball bumps 28 and 32 coincides with that between the lead, which is then heated and bonded to the lead frame. Accordingly, the film capacitor can be easily mounted on any of the lead frames.

In such a manner, the semiconductor chip is resin-sealed to complete a semiconductor device.

Figure 11:
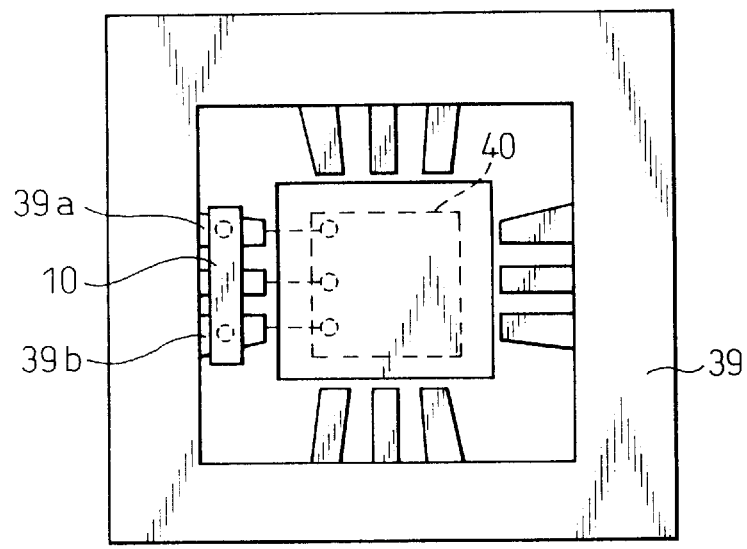
FIGS. 11, 12 and 13 are illustrations, respectively, for explaining a state wherein the film capacitor is mounted on a package body.
Figure 12:
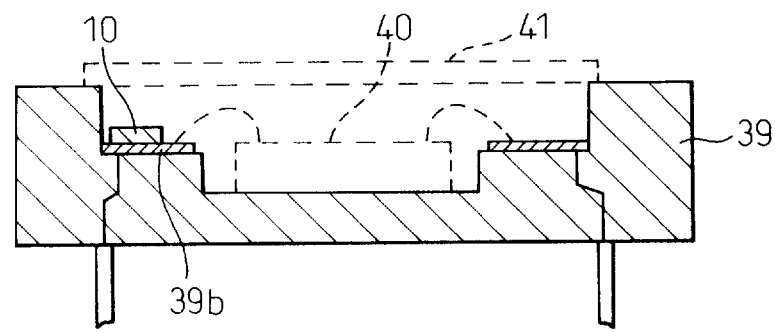
Figure 13:
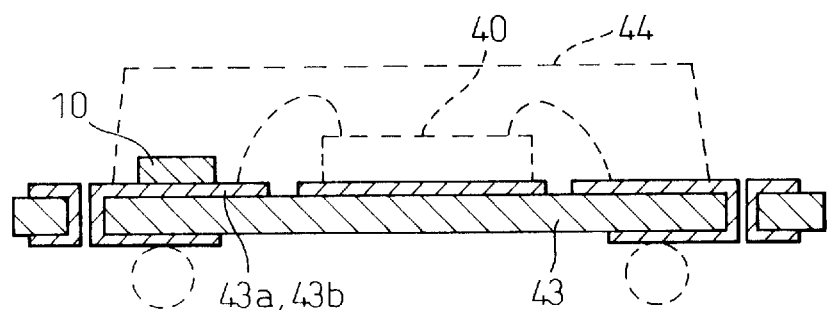

FIGS. 11 and 12 illustrate a package formed by mounting a film capacitor 10 onto a power supply line 39*a* and a ground line 39*b* of a ceramic or plastic package body 39. If a chip 40 is mounted on this package and electrically connected to a circuit pattern via wires or the like and sealed with a cap 41, a semiconductor device is completed. FIG. 13 illustrates an example wherein the film capacitor 10 is mounted on a power supply line 43*a* and a ground line 43*b* of a body 43 of a PBGA type package to form a semiconductor device package. If a semiconductor chip 40 is mounted thereto, electrically connected as required and sealed with a resin 44, a semiconductor device is completed.

Figure 14:
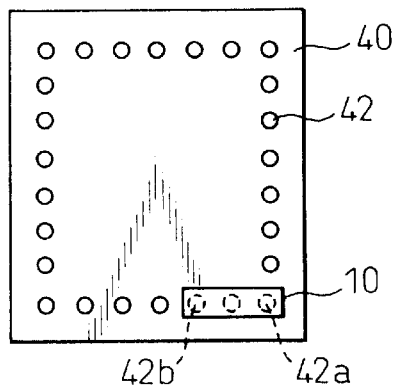
FIG. 14 is a plan view of the film capacitor mounted on the semiconductor chip.

FIG. 14 illustrates a semiconductor chip 40 carrying a film capacitor 10 thereon.

Pads 42 are arranged at a predetermined pattern on the semiconductor chip 40. Of them, a power supply pad 42*a* and a ground pad 42*b* are located selected so that a distance therebetween is the same as that between both the ball bumps 28 and 32.

Accordingly, it is possible to mount and electrically connect the film capacitor 10 to the power supply pad 42*a* and the ground pad 42*b* via the ball bumps 28 and 32.

According to this embodiment, since the film capacitor 10 is directly mounted on the semiconductor chip 40, it is possible to effectively reduce a noise originated from the power supply. Also, the mounting of the film capacitor 10 to the semiconductor chip 40 is facilitated.

Various semiconductor devices are obtainable by sealingly mounting semiconductor chips 40 carrying these film capacitors 10 thereon to desired packages. Of course, the present invention is applicable not only to a resin-sealed type semiconductor device but also to that using a ceramic package or others.

Figure 15:
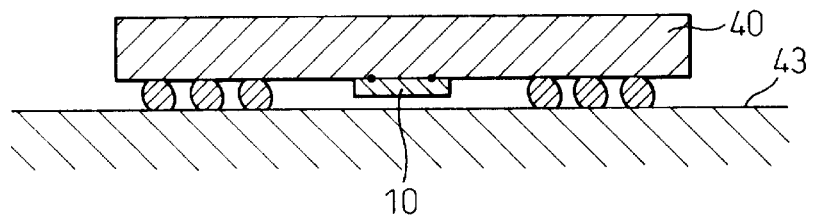
FIG. 15 is an illustration for explaining a state wherein the film capacitor is mounted on a front surface of the semiconductor chip and the semiconductor chip is flip-connected.

FIG. 15 shows a case wherein a semiconductor chip 40 with a film capacitor 10 as described above is flip chip-connected to a package body 43. According to this embodiment, a space is effectively used because the film capacitor 10 is accommodated in a gap between the semiconductor chip 40 and the package body 43.

Figure 16:
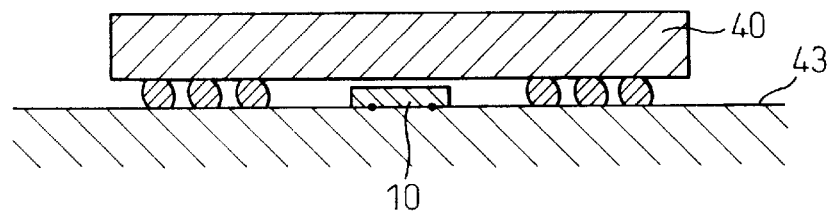
FIG. 16 is an illustration for explaining a state wherein the film capacitor is located between the semiconductor chip and the package body.

FIG. 16 illustrates a similar semiconductor device wherein the semiconductor chip 40 is flip-chip-connected to the package body 43. In this embodiment, however, the film capacitor 10 is placed in a space between the semiconductor chip 40 and the package body 43 while striding over the power supply line and the ground line of the package body 43. Also in this embodiment, it is possible to effectively use a space. In this case, the film capacitor 10 to be mounted on the package body 43 may be any one of those shown in the first to third embodiments. The second electrode layer (not shown) is connected to a power supply pad or a ground pad provided in the semiconductor chip 40.

In the above embodiments wherein the film capacitor 10 is directly mounted onto the semiconductor chip 40, the film capacitor 10 is carried on the front surface of the semiconductor chip 40.

Figure 17:
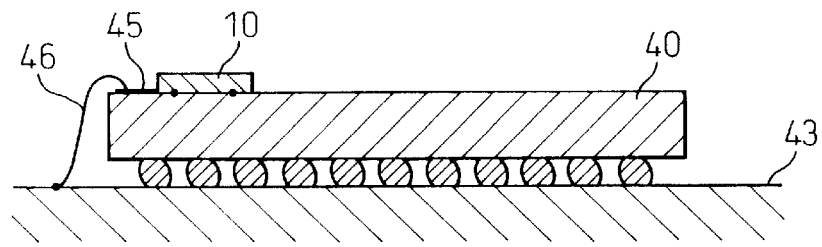
FIG. 17 is an illustration for explaining a state wherein the film capacitor is mounted on a back surface of the semiconductor chip.

FIG. 17 illustrates a semiconductor chip 40 carrying a film capacitor 10 on a back surface thereof. In this case, a power supply pad and a ground pad are drawn out onto the back surface of the semiconductor chip 40, and the film capacitor 10 is located to stride over the power supply pad and the ground pad, and is electrically connected thereto via external connection terminals thereof. Preferably, a circuit pattern 45 drawn out from the power supply line is connected to a power supply line of a package body 43. Also, in this embodiment, it is possible to reduce the noise derived from the electric power supply because the film capacitor 10 is directly mounted onto the semiconductor chip 40. Since the back surface of the semiconductor chip 40 is effectively used, it is possible to provide the circuit patterns on the front surface of the semiconductor chip 40 at a high density.

As the case may be, a semiconductor chip with a film capacitor (not shown) may be formed by mounting a film capacitor 10 of any one of those described with reference to the first to third embodiments onto a ground pad or a power supply pad drawn to the back surface of the semiconductor chip 40. In this case, a second electrode of the film capacitor 10 is electrically connected to the power line or the ground line of the package body 43 via wires. Also, in this embodiment, it is possible to reduce the noise derived from the electric power source and provide the circuit patterns on the front surface of the semiconductor chip 40 at a high density.

Although the present invention was described in detail above with reference to the preferred embodiments, it should be noted that the present invention is not limited thereto but includes various changes and modifications without departing from the scope and spirit of the invention.

According to the film capacitor of the present invention, since external connection terminals for the electrical connection with a first electrode layer are formed on a surface of a substrate opposite to that on which the first electrode layer is formed, the mounting thereof onto a circuit pattern of a semiconductor device package, such as a front end of a lead of a lead frame is facilitated. Also, a semiconductor device capable of reducing the noise originated from a power source is provided.

Further, since external connection terminals are provided on a surface of a substrate opposite to that on which a first electrode layer is formed, for the electrical connection with the first electrode layer and a second electrode layer, respectively, it is possible to easily mount the film capacitor onto a power supply line or a ground line of a semiconductor device package, such as a lead frame, or a power supply pad or a ground pad of a semiconductor chip. Also, a semiconductor device capable of reducing the noise originating from a power source is provided.

What is claimed is:

1. A thin film capacitor comprising:
   a substrate made of polyimide and having first and second surfaces;
   a plated layer of a nickel plated layer and a chrome plated layer as an underlayer of said nickel plated layer, said plated layer formed on said first surface of the substrate;
   a first electrode film formed on said plated layer on said first surface of the substrate;
   a high-dielectric film formed on said first electrode film;
   a second electrode film formed on said high-dielectric film; and at least one external connection terminal formed on said second surface of the substrate opposite to said first surface on which said first electrode film is formed in such a manner that said external connection terminal is electrically connected to said first electrode film.

2. A thin film capacitor as set forth in claim 1, wherein said external connection terminal is a ball bump.

3. A thin film capacitor comprising:
   a substrate made of an iron alloy and having first and second surfaces;
   a plated layer of a nickel film formed on said first surface of the substrate;
   a first electrode film formed on said plated layer on said first surface of the substrate;
   a high-dielectric film formed on said first electrode film;
   a second electrode film formed on said high-dielectric film; and
   at least one external connection terminal formed on said second surface of the substrate opposite to said first surface on which said first electrode film is formed in such a manner that said external connection terminal is electrically connected to said first electrode film.

4. A semiconductor device comprising: a package comprising:
   a package body having a surface, at least a power supply line and a ground line being formed on said surface;
   a thin film capacitor comprising: a substrate having first and second surfaces; a first electrode film formed on said first surface of the substrate; a high-dielectric film formed on said first electrode film; a second electrode film formed on said high-dielectric film; and at least one external connection terminal formed on said second surface of the substrate opposite to said first surface on which said first electrode film is formed in such a manner that said external connection terminal is electrically connected to said first electrode film; said thin film capacitor being mounted on said power supply line or ground line on said package body in such a manner that said external connection terminal of the thin film capacitor is electrically connected to one of said power supply and ground lines;
   a semiconductor chip having at least a power supply pad and a ground pad, said semiconductor chip being mounted on said package in such a manner that said second electrode film of the thin film capacitor is electrically connected to one of said power supply and ground pads by means of wire bonding; and
   a sealing material hermetically sealing said semiconductor chip on said package.

5. A thin film capacitor comprising:
   a substrate made of polyimide and having first and second surfaces;
   a plated layer of a nickel plated layer and a chrome plated layer as an underlayer of said nickel plated layer, said plated layer formed on said first surface of the substrate
   a first electrode film formed on said plated layer on said first surface of the substrate;
   a high-dielectric film formed on said first electrode film;
   a second electrode film formed on said high-dielectric film;
   first and second external connection terminals formed on said second surface of the substrate opposite to said first surface on which said first electrode film is formed in such a manner that said first and second external connection terminals are electrically connected to said first and second electrode films, respectively.

6. A thin film capacitor as set forth in claim 5, wherein said second external connection terminal is electrically connected to said second electrode film via a through hole penetrating through said substrate, said first electrode film, said high-dielectric film and has an inner wall coated with a said high-dielectric film.

7. A thin film capacitor as set forth in claim 5, wherein said external connection terminal is a ball bump.

8. A thin film capacitor comprising:
   a substrate made of an iron alloy and having first and second surfaces;
   a plated layer of a nickel film, said plated layer formed on said first surface of the substrate;
   a first electrode film formed on said plated layer on said first surface of the substrate;
   a high-dielectric film formed on said first electrode film;
   a second electrode film formed on said high-dielectric film; and
   first and second external connection terminals formed on said second surface of the substrate opposite to said first surface on which said first electrode film is formed in such a manner that said first and second external connection terminals are electrically connected to said first and second electrode films, respectively.

9. A semiconductor device comprising:
   a package comprising:

a package body on which at least a power supply line and a ground line are formed;

a thin film capacitor comprising: a substrate having first and second surfaces; a first electrode film formed on said first surface of the substrate; a high-dielectric film formed on said first electrode film; a second electrode film formed on said high-dielectric film; and first and second external connection terminals formed on said second surface of the substrate opposite to said first surface on which said first electrode film is formed in such a manner that said first and second external connection terminals are electrically connected to said first and second electrode films, respectively;

a semiconductor chip having at least a power supply pad and a ground pad, said semiconductor chip being mounted on said package by a flip-chip connection and in such a manner that said second electrode of the thin film capacitor is electrically connected to one of said power supply and ground pads;

said thin film capacitor being mounted on said package body in such a manner that said first and second external connection terminals of the thin film capacitor are electrically connected to said power supply and ground lines, respectively, and so that said thin film capacitor is located in a space between said package body and said semiconductor chip; and a sealing material hermetically sealing said semiconductor chip on said package.

10. A semiconductor device comprising:

a semiconductor package;

a semiconductor chip mounted on said package by a flip-chip connection and having at least a power supply pad and a ground pad;

a thin film capacitor comprising: a substrate having first and second surfaces; a first electrode film formed on said first surface of the substrate; a high-dielectric film formed on said first electrode film; a second electrode film formed on said high-dielectric film; and first and second external connection terminals formed on said second surface of the substrate opposite to said first surface on which said first electrode film is formed in such a manner that said first and second external connection terminals are electrically connected to said first and second electrode films, respectively; and said thin film capacitor being mounted on said package in such a manner that said first and second external connection terminals of the thin film capacitor are electrically connected to said power supply and ground lines, respectively, and said thin film capacitor is located in a space between said package body and said semiconductor chip.

* * * * *